US006949812B2

United States Patent
Losehand et al.

(10) Patent No.: US 6,949,812 B2
(45) Date of Patent: Sep. 27, 2005

(54) METHOD FOR MANUFACTURING A HIGH FREQUENCY SEMICONDUCTOR STRUCTURE AND HIGH FREQUENCY SEMICONDUCTOR STRUCTURE

(75) Inventors: Reinhard Losehand, München (DE); Hubert Werthmann, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/253,197

(22) Filed: Sep. 24, 2002

(65) Prior Publication Data

US 2003/0064575 A1 Apr. 3, 2003

Related U.S. Application Data

(63) Continuation of application No. PCT/EP01/02471, filed on Mar. 5, 2001.

(30) Foreign Application Priority Data

Mar. 24, 2000  (EP) .............................................. 00106460

(51) Int. Cl.[7] ....................... H01L 31/075; H01L 29/00; H01L 21/8238; H01L 21/20
(52) U.S. Cl. ....................... 257/656; 257/523; 438/379; 438/223
(58) Field of Search ................................. 257/523, 656, 257/191, 12; 438/223, 559, 227, 379, 479

(56) References Cited

U.S. PATENT DOCUMENTS

| 4,732,870 | A | | 3/1988 | Mimura | |
|---|---|---|---|---|---|
| 5,182,620 | A | * | 1/1993 | Shimada et al. | 257/72 |
| 5,442,205 | A | * | 8/1995 | Brasen et al. | 257/191 |
| 6,426,547 | B1 | * | 7/2002 | Greenberg et al. | 257/656 |
| 2003/0199153 | A1 | * | 10/2003 | Kovacic et al. | 438/479 |

FOREIGN PATENT DOCUMENTS

DE  197 37 360 C1  1/1999

OTHER PUBLICATIONS

Rohde, U. L.: "Microwave and Wireless Synthesizers", John Wiley & Sons Inc., 1997, pp. 60–64.

* cited by examiner

Primary Examiner—Amir Zarabian
Assistant Examiner—Kiesha Rose
(74) Attorney, Agent, or Firm—Laurence A. Greenberg; Werner H. Stemer; Ralph E. Locher

(57) ABSTRACT

A semiconductor structure for high frequency operation has a substrate with a doped well formed therein and a buffer layer made of a substrate material covers the well. The buffer layer is made of an undoped material and is disposed on a top side of the well for inhibiting an outdiffusion of a dopant from the well. At least a portion of the substrate is not covered by the buffer layer.

15 Claims, 14 Drawing Sheets

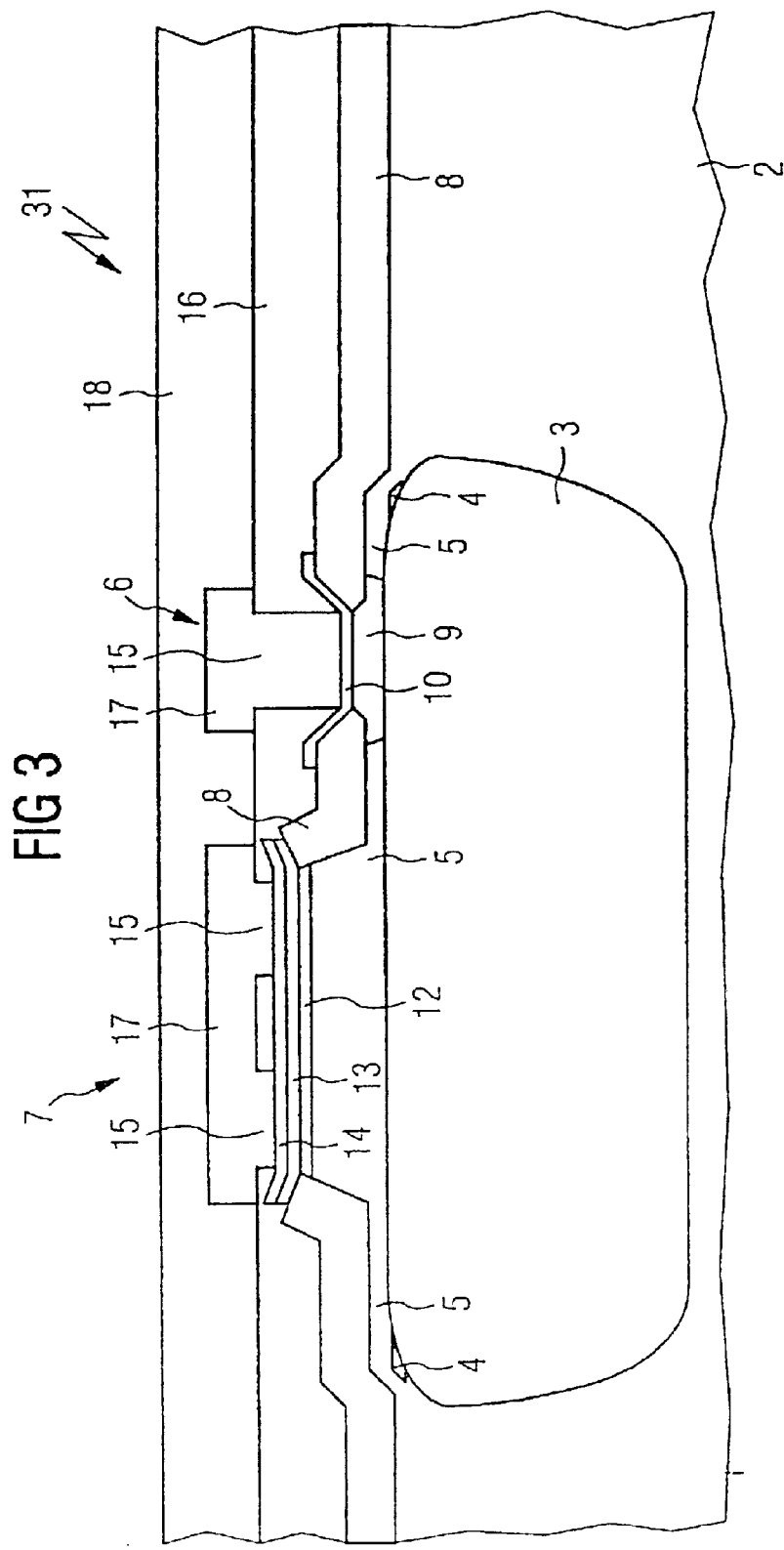

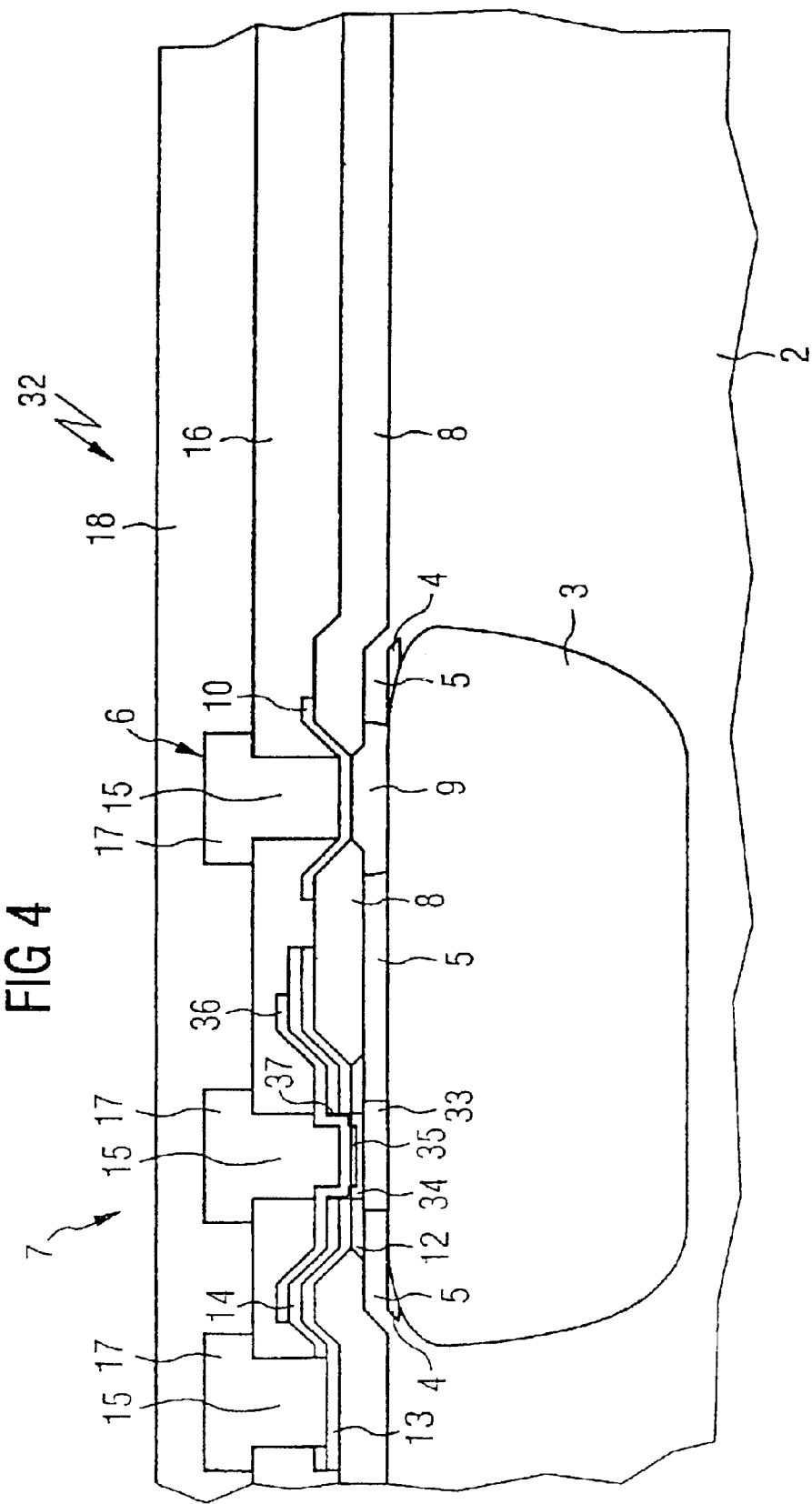

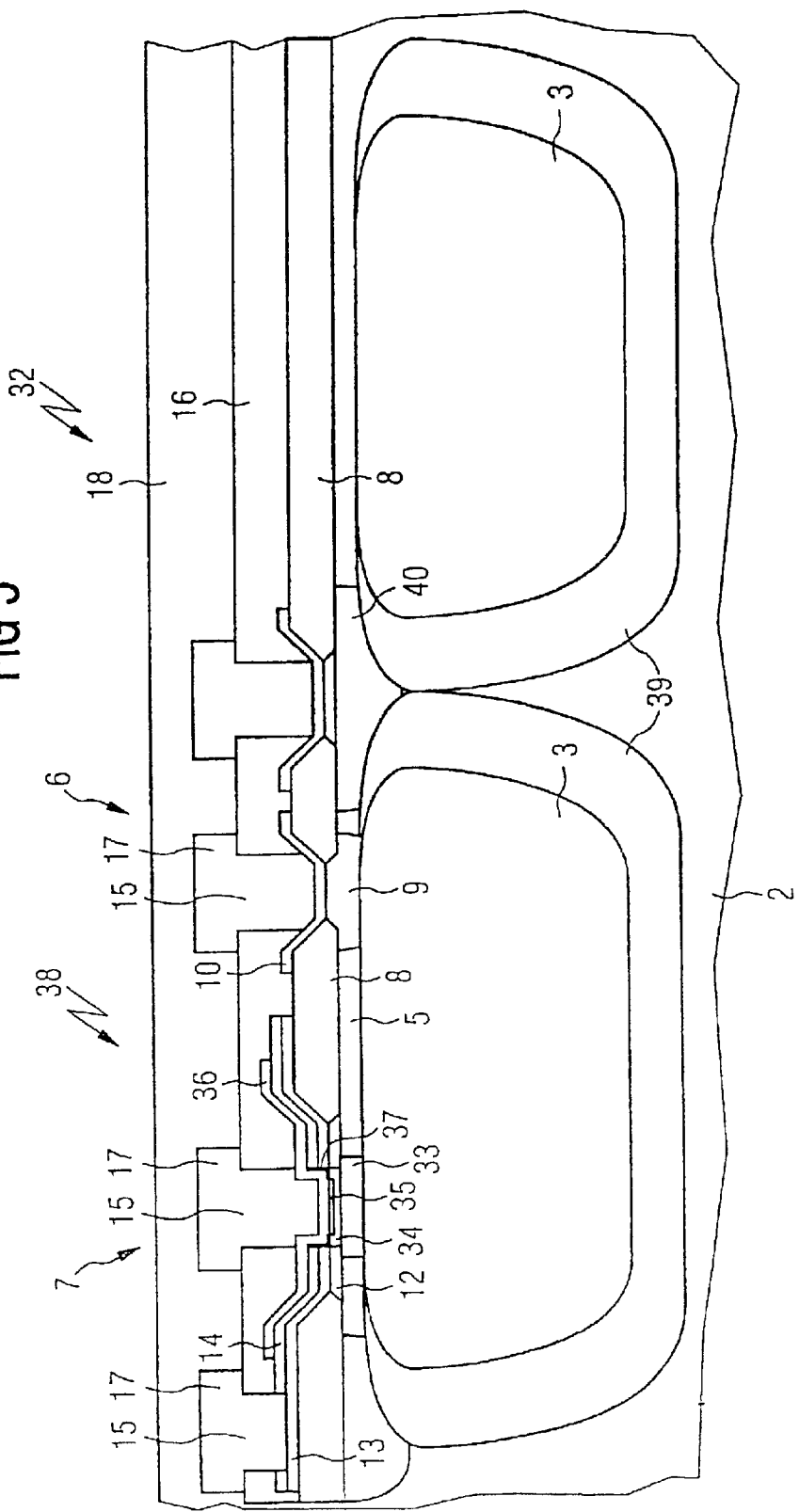

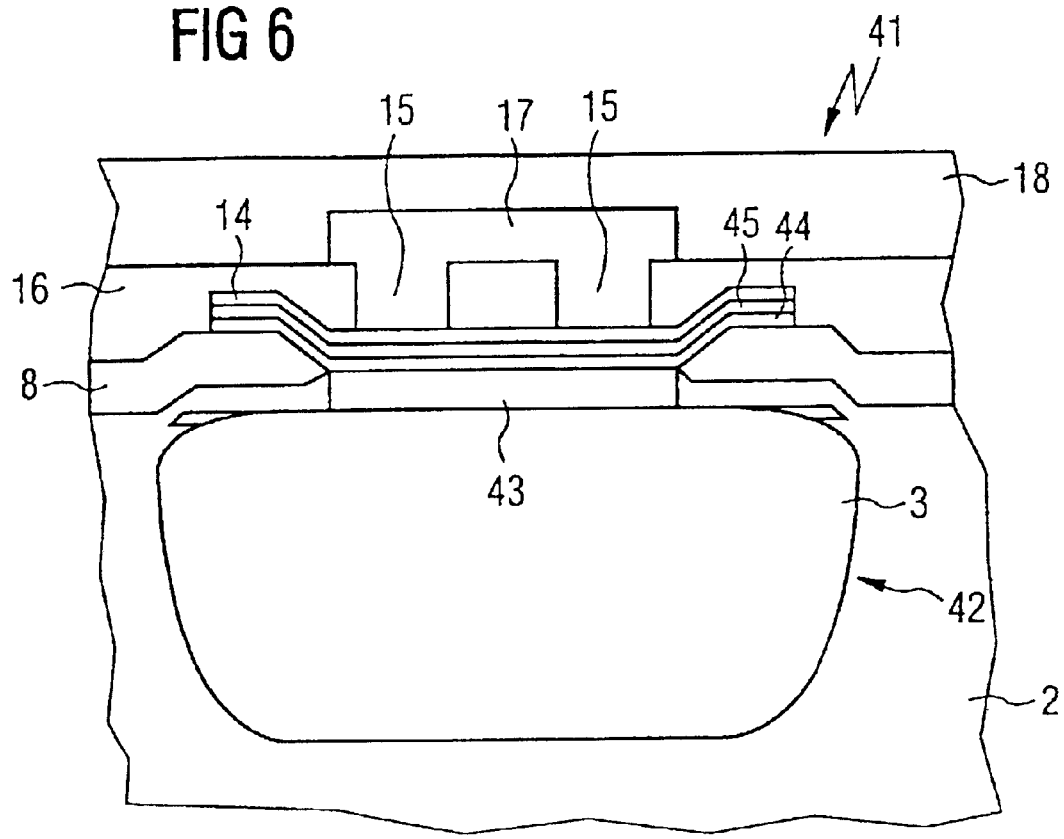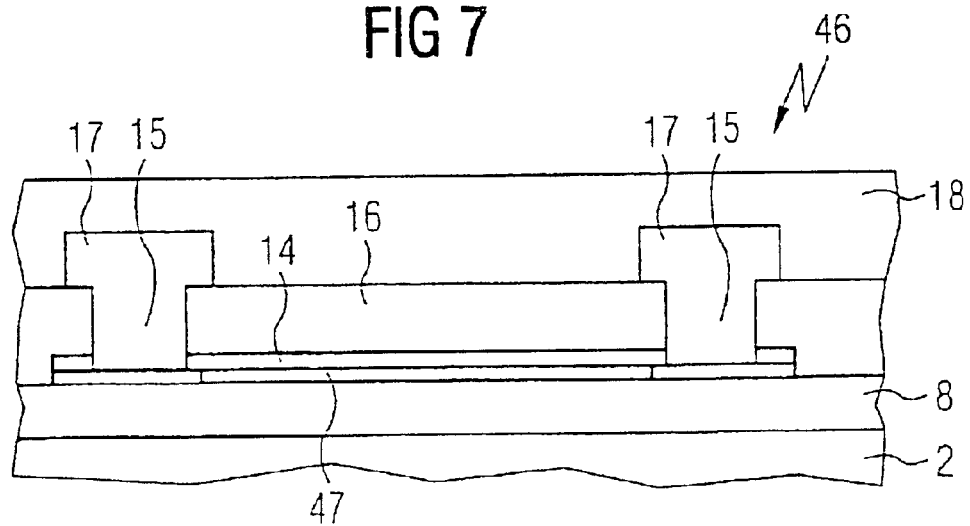

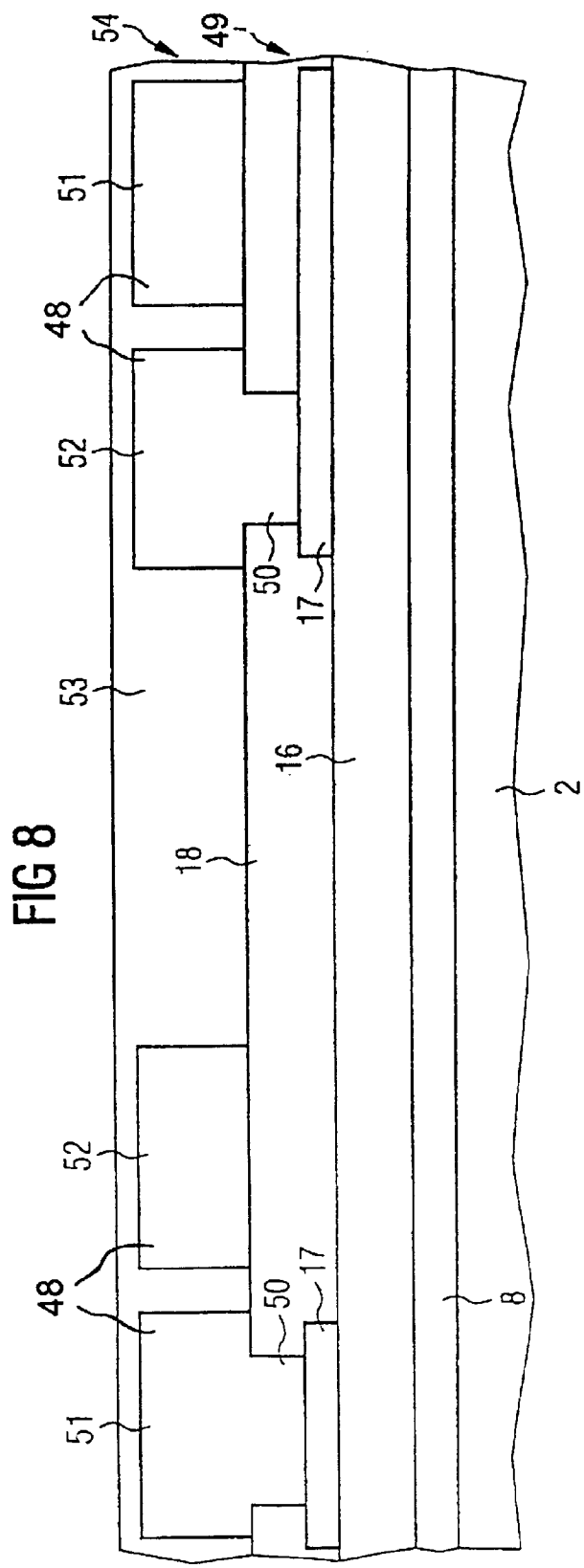

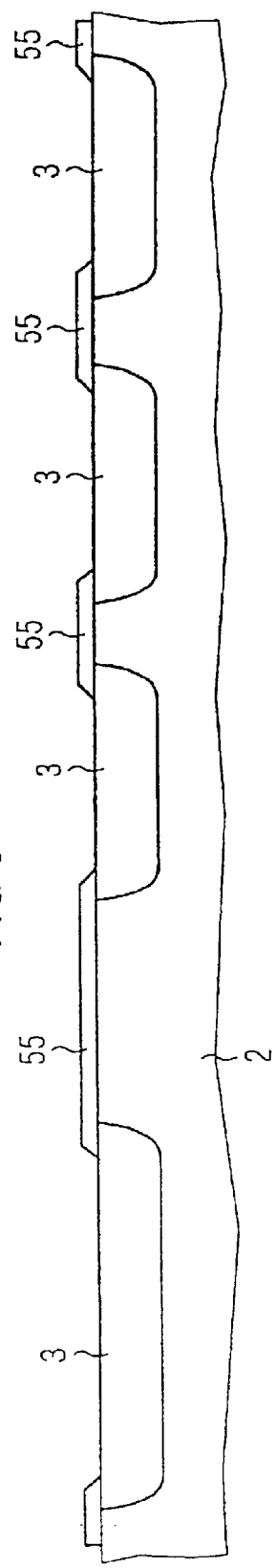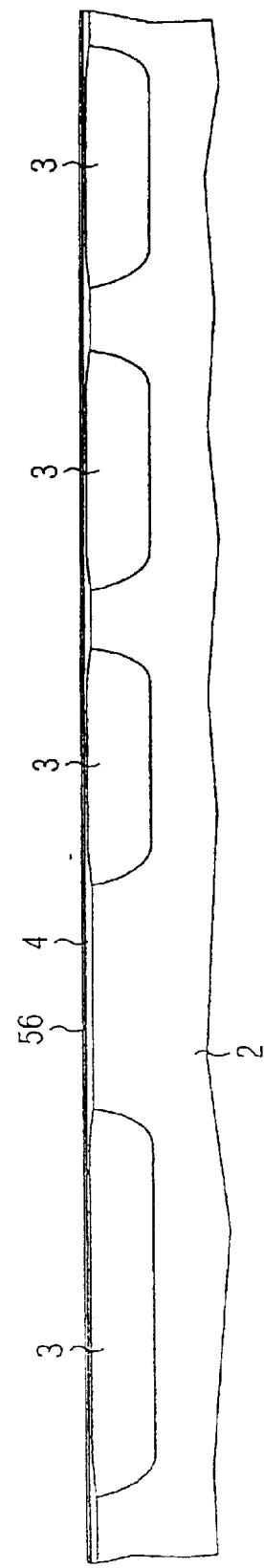

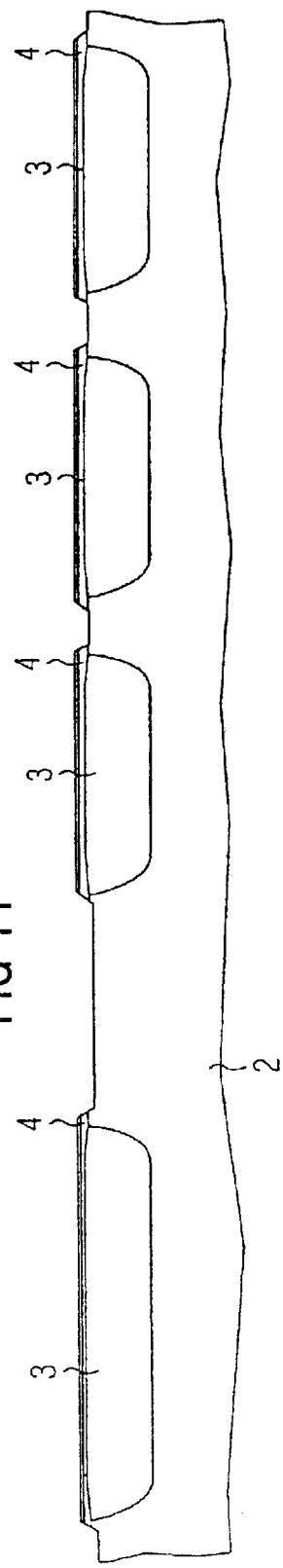
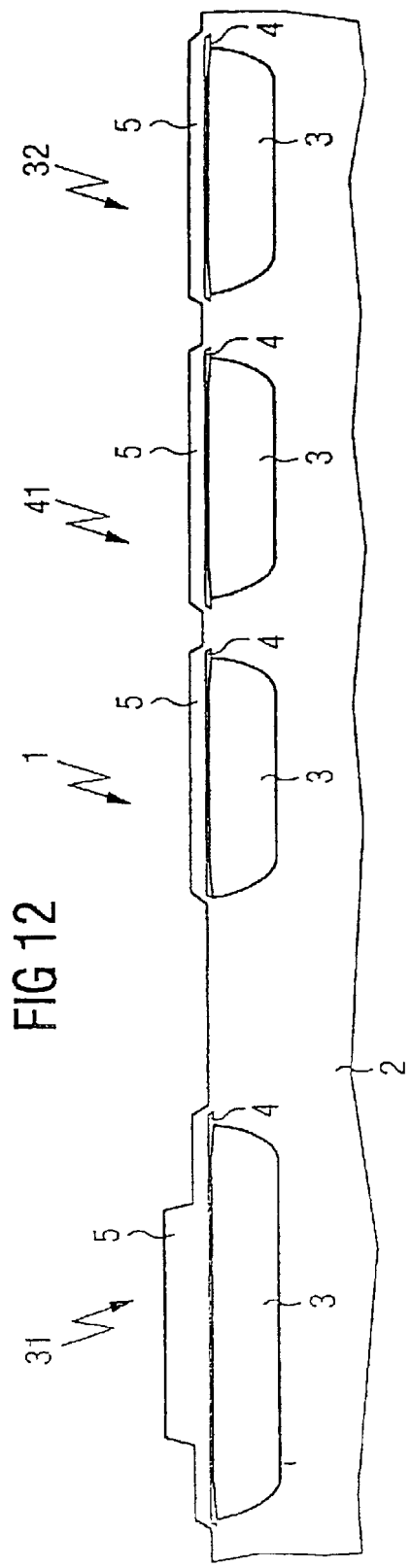

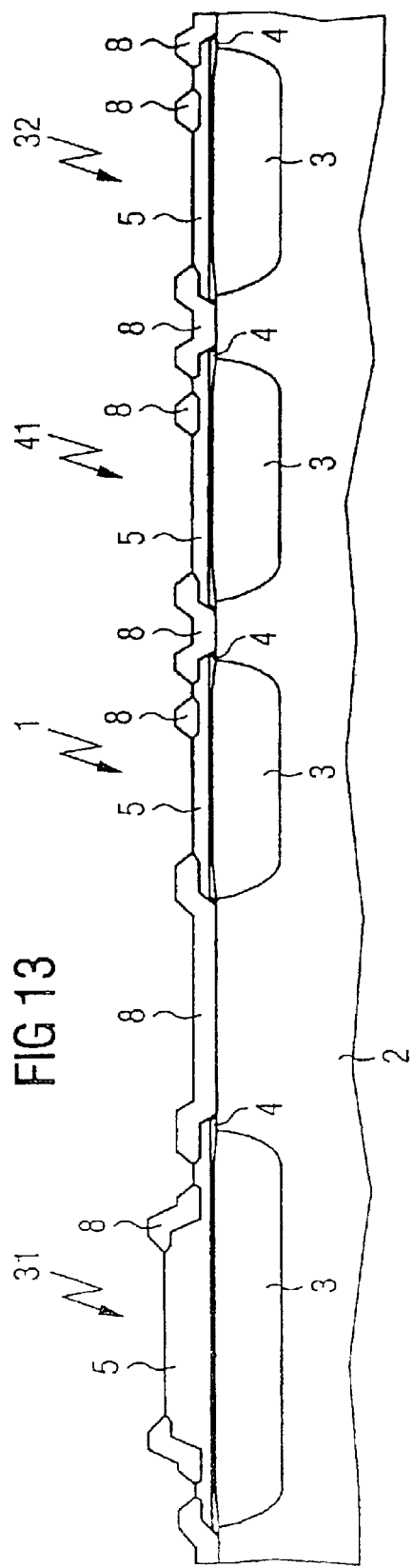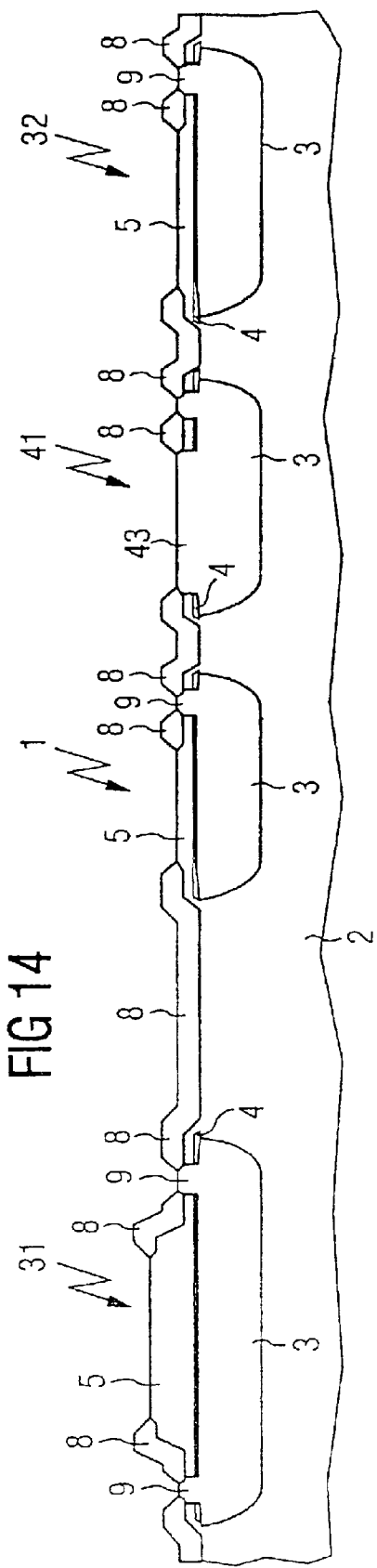

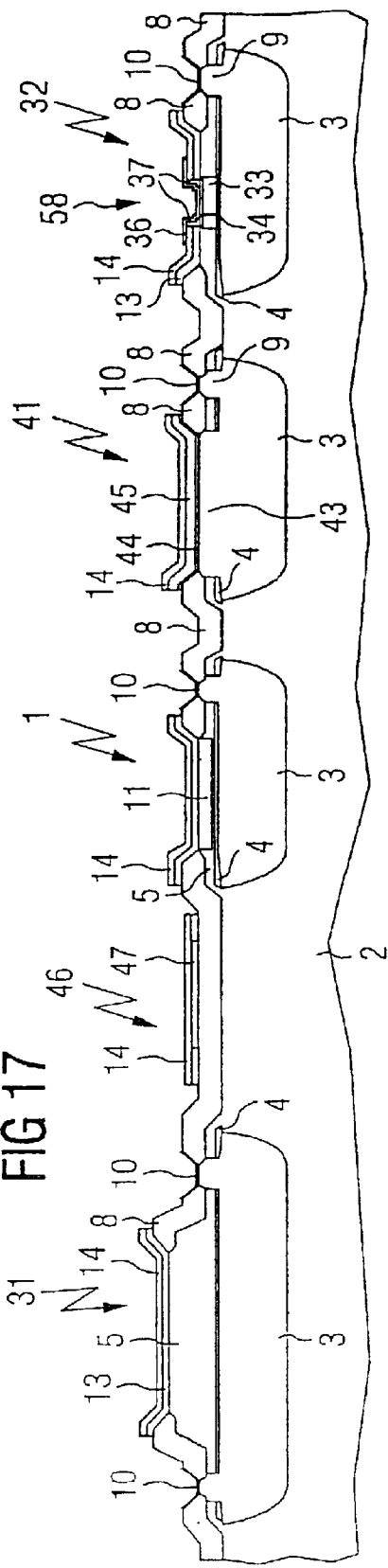
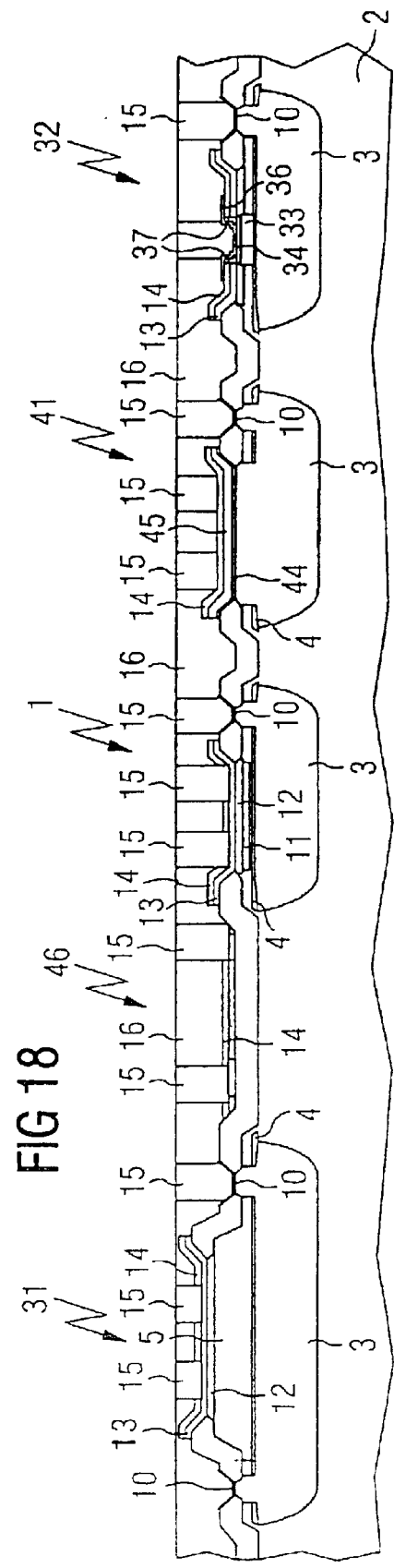

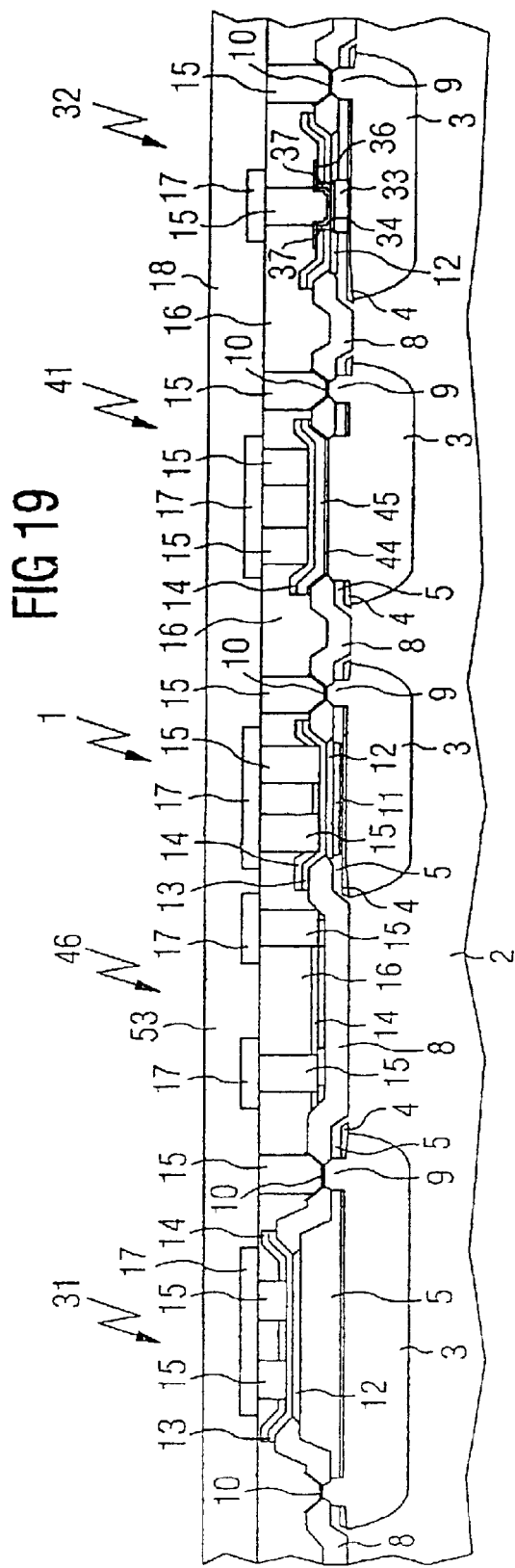

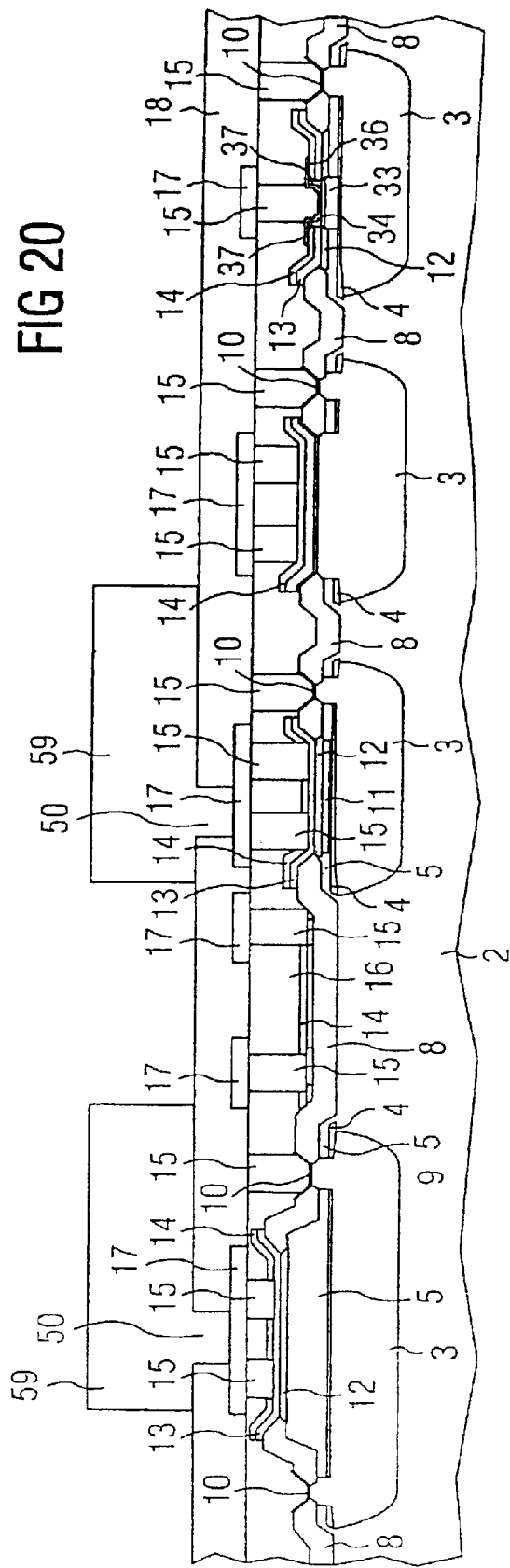

METHOD FOR MANUFACTURING A HIGH FREQUENCY SEMICONDUCTOR STRUCTURE AND HIGH FREQUENCY SEMICONDUCTOR STRUCTURE

CROSS-REFERENCE TO RELATED APPLICATION

This application is a continuation of copending International Application No. PCT/EP01/02471, filed Mar. 5, 2001, which designated the United States and was not published in English.

BACKGROUND OF THE INVENTION

Field of the Invention

The invention relates to a method for manufacturing a high frequency semiconductor structure having the following method steps: preparing a substrate; forming a well on one side of the substrate; and epitaxially growing a buffer layer above the well.

The invention also relates to a semiconductor structure having a well that is formed in a substrate and a buffer layer made of substrate material formed above the well.

Issued German Patent DE 197 37 360 C1 discloses a high frequency Schottky diode and a method for manufacturing the diode. An n-type doped layer is formed in a p-type doped substrate in order to manufacture the known high frequency Schottky diode. In a subsequent step, an n-type doped epitaxial layer is applied to the well. The epitaxial layer is then patterned using photographic technology and plasma etching such that only a central region of the well continues to be covered by the epitaxial layer. This results in an elevation on the well that is surrounded by an annular depression. In subsequent method steps, inter alia, a metal layer is deposited on the elevation in order to form a Schottky contact.

The well is doped with arsenic and has a dopant content of $5 \times 10^{19}$ cm$^{-3}$ to $6 \times 10^{19}$ cm$^{-3}$. In addition, the substrate is defined by a resistivity of more than 3 k$\Omega$cm. This effectively limits the losses of the high frequency Schottky diode.

In order to manufacture hand-held mobile phone devices, all of the components of the circuit arrangement should be monolithically integrated as much as possible. The operating frequencies provided are around 1 GHz and above. In this frequency range stringent requirements are made of the quality of the passive and active components used. In this frequency range, discrete circuits generally have an average quality of 100 when averaged over the various active and passive components. Thus, for example, the combination of a high quality resonator (Q=200) with average quality diodes (Q=50) still leads to an average quality in the region of 100. As should be expected, peak quality levels cannot be achieved when active and passive components are integrated, therefore an average quality of approximately 100 must be required for the individual active and passive components. In particular, it is necessary also to pay attention to the quality of the transistors. Although the loss that happens to be present is compensated by the transistor gain, increasing the transistor gain also entails an increase in the noise in the circuit. For this reason, the transistor losses should also be kept as low as possible.

SUMMARY OF THE INVENTION

It is accordingly an object of the invention to provide a high-frequency semiconductor structure and a method for manufacturing the semiconductor structure, which overcome the above-mentioned disadvantages of the prior art apparatus and methods of this general type.

In particular, it is an object of the invention to provide a method for manufacturing semiconductor structures that are as loss-free as possible.

In addition, it is an object of the invention to provide a semiconductor structure with low losses, and thus with a high quality level.

In the method and in the semiconductor structure, in each case a buffer layer is provided that covers the well that is formed in the substrate. Undoped material is provided for manufacturing the epitaxially applied buffer layer. A result of the autodoping is that the buffer layer contains doping atoms that evaporate from the well during the epitaxial growth of the buffer layer, and these doping atoms are introduced into the buffer layer. This results in a conductive layer. As leakage currents can flow via the conductive buffer layer, that part of the buffer layer that is not supported on the well must be removed. By removing the layer that rests directly on the substrate, the bleeder resistance is effectively increased. This is because hardly any autodoping takes place in successive epitaxy operations because of the low dopant content at the surface of the buffer layer. Accordingly, the subsequent epitaxial layers have a low conductivity. In order to limit the bleeder resistance at the edges of the well, it is therefore sufficient first to grow on a buffer layer epitaxially until no more autodoping takes place, and then to reduce the thickness of the buffer layer in the region outside the wells or remove it completely.

In one embodiment of the method, a high impedance substrate is used in which a well with the lowest possible impedance is formed.

As a result, it is possible to reduce the internal resistance of the well on one hand. On the other hand, the capacitance of the boundary area between the well and substrate is also reduced and the bleeder resistance of the substrate increased. The aforesaid measures enable the power loss of components that use the well as one of their electrodes to be reduced.

However, removing or thinning out the buffer layer is also advantageous for components without a well formed in the substrate. This is because the absence of a buffer layer leads to a high impedance substructure for those passive components that do not require a well in the substrate. As a result, high parallel resistances are obtained which result in low losses.

With the foregoing and other objects in view there is provided, in accordance with the invention, a method for manufacturing a high frequency semiconductor structure. The method includes steps of: preparing a substrate; forming a doped well on one side of the substrate; epitaxially growing a buffer layer above the well; manufacturing the buffer layer above the well from an undoped material; and at least partially removing a portion of the buffer layer covering the substrate.

In accordance with an added mode of the invention, the method includes: completely removing the portion of the buffer layer covering the substrate.

In accordance with an additional mode of the invention, the substrate is a high impedance substrate with a resistivity greater than 1 k$\Omega$cm.

In accordance with another mode of the invention, the well is doped with a concentration of more than $6 \times 10^{19}$ cm$^{-3}$.

In accordance with a further mode of the invention, after processing the buffer layer, applying layered sequences to form bipolar transistors and varactors.

In accordance with a further added mode of the invention, after performing the step of applying the layered sequences, performing a brief heat treatment between 750° C. and 850° C. and between 1000° C. and 1100° C.

In accordance with yet an added mode of the invention, the method includes: forming a well having an edge in the substrate. The substrate has a region at the edge of the well with an increased doping with respect to remaining portions of the substrate.

In accordance with yet an additional mode of the invention, the method includes: connecting the region at the edge of the well to a ground contact.

With the foregoing and other objects in view there is provided, in accordance with the invention, a semiconductor structure for high frequencies. The semiconductor structure includes: a substrate having a doped well formed therein; and a buffer layer made of substrate material covering the well. The buffer layer is manufactured from an undoped material, and at least a portion of the substrate is not covered by the buffer layer.

In accordance with an added feature of the invention, a bipolar transistor is formed in the substrate, and the transistor has a collector formed by the well.

In accordance with an additional feature of the invention, there is provided, a varactor having an electrode formed by the well.

In accordance with another feature of the invention, there is provided, a PIN diode having an electrode formed by the well.

In accordance with a further feature of the invention, there is provided, a capacitor having an electrode is formed by the well.

In accordance with a further added feature of the invention, there is provided, a resistor manufactured from a semiconductor material; the resistor being formed on the substrate.

In accordance with a further additional feature of the invention, there is provided, a coil formed from conductor tracks.

Other features which are considered as characteristic for the invention are set forth in the appended claims.

Although the invention is illustrated and described herein as embodied in a method for manufacturing a high frequency semiconductor structure and high frequency semiconductor structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a cross sectional view of a PIN diode;

FIG. 4 is a cross sectional view of a bipolar transistor;

FIG. 5 is a cross sectional view of a configuration of bipolar transistors with a high packing density;

FIG. 6 is a cross sectional view of a capacitor with a well formed in the substrate;

FIG. 7 is a cross sectional view of a resistor;

FIG. 8 is a cross sectional view of a coil; and

FIGS. 9 to 20 are cross sectional views of a semiconductor structure during the manufacturing process.

DESCRIPTION OF THE PREFERRED EMBODIMENTS

Figure 1:
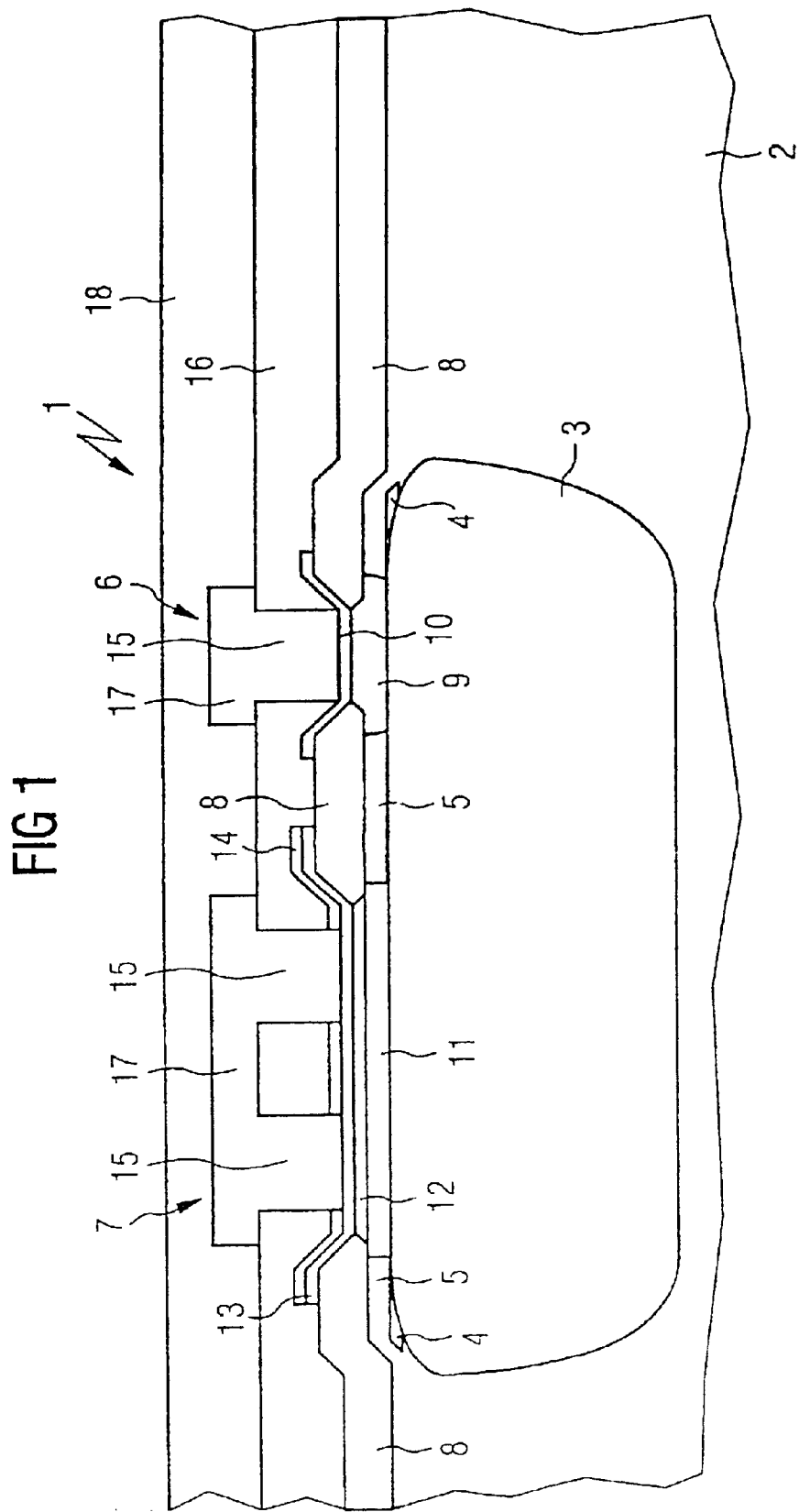
FIG. 1 is a cross sectional view of a varactor.

In the following description of the exemplary embodiments represented throughout the figures, identical reference numerals identify parts that respectively correspond to one another.

Referring now to the figures of the drawing in detail and first, particularly, to FIG. 1 thereof, there is shown a varactor 1. The varactor 1 has a high impedance substrate 2 with a resistivity of greater than 1 kΩcm. A low impedance well 3 (buried layer) is formed in the substrate 2. The well 3 preferably has a resistance of less than 5 Ω/square. In order to achieve these values, the doping of the substrate 2 should be below $8 \times 10^{12}$ cm$^{-3}$, and the doping of the well should be above $5 \times 10^{19}$ cm$^{-3}$. In addition, the well 3 should have a depth of more than 10 μm. This results in layer resistances of only 3 Ω for the well 3.

Above the well 3, a buffer layer 4 is formed that has been etched back outside the well 3. On the buffer layer 4, an epitaxial layer 5 is arranged which, with the exception of a collector region 6 and a base region 7, is covered by an insulating layer 8. In the collector region 6, a contact region 9, which is adjoined by a collector contact layer 10, is formed in the epitaxial layer 5. In the base region 7, a profiled implantation 11 is introduced in the epitaxial layer 5. The method of doping this profiled implantation 11 corresponds to the method of doping the well 3. In addition, a base layer 12 that has the opposite doping from the profiled implantation 11 and the well 3 is present in the epitaxial layer 5 in the base region 7. A base contact layer 13 is arranged after the base layer 12 and the edges of the base contact layer 13 rest on the insulating layer 8. Above the base contact layer 13, there is a contact insulating layer 14 which is interrupted by connecting contacts 15. A connecting contact 15 which bears against the collector contact layer 10 is also provided in the collector region 6. The connecting contacts 15 lead through a cover layer 16 to conductor tracks 17 which are embedded in an intermediate layer dielectric 18.

For example p-type conductive silicon with the crystal orientation <100> is used as the substrate 2. As already mentioned, the doping of the silicon should be less than $8 \times 10^{12}$ cm$^{-3}$. The well 3 is formed, for example, by doping the substrate 2 with arsenic with a concentration of more than $5 \times 10^{19}$ cm$^{-3}$. The buffer layer 4, the epitaxial layer 5, and the base layer 12 are also manufactured from silicon in this case, and the base layer 12 is n-type doped using boron. The base contact layer 13 and the collector contact layer 10 are expediently fabricated from n-type doped polysilicon in the exemplary embodiment illustrated in FIG. 1. The insulating layer 8 and the contact insulating layer 14 are oxide layers, for example, SiO$_2$. The cover layer 16 can be fabricated from boron-containing phosphorus glass (BPSG). The intermediate layer dielectric 18 is finally an IMOX layer. The connecting contacts 15 may be fabricated from a tungsten alloy. AlSiCu is provided for the conductor tracks 17.

The concentration of the doping atoms in the base layer 12 is $10^{20}$ cm$^{-3}$. This is followed by the profiled implantation 11 with a concentration of doping atoms that drops from $10^{18}$ cm$^{-3}$ to $10^{16}$ cm$^{-3}$. The base contact layer 13 and the collector contact layer 10 are each doped with a concentration of $10^{21}$ cm$^{-3}$.

Figure 2:
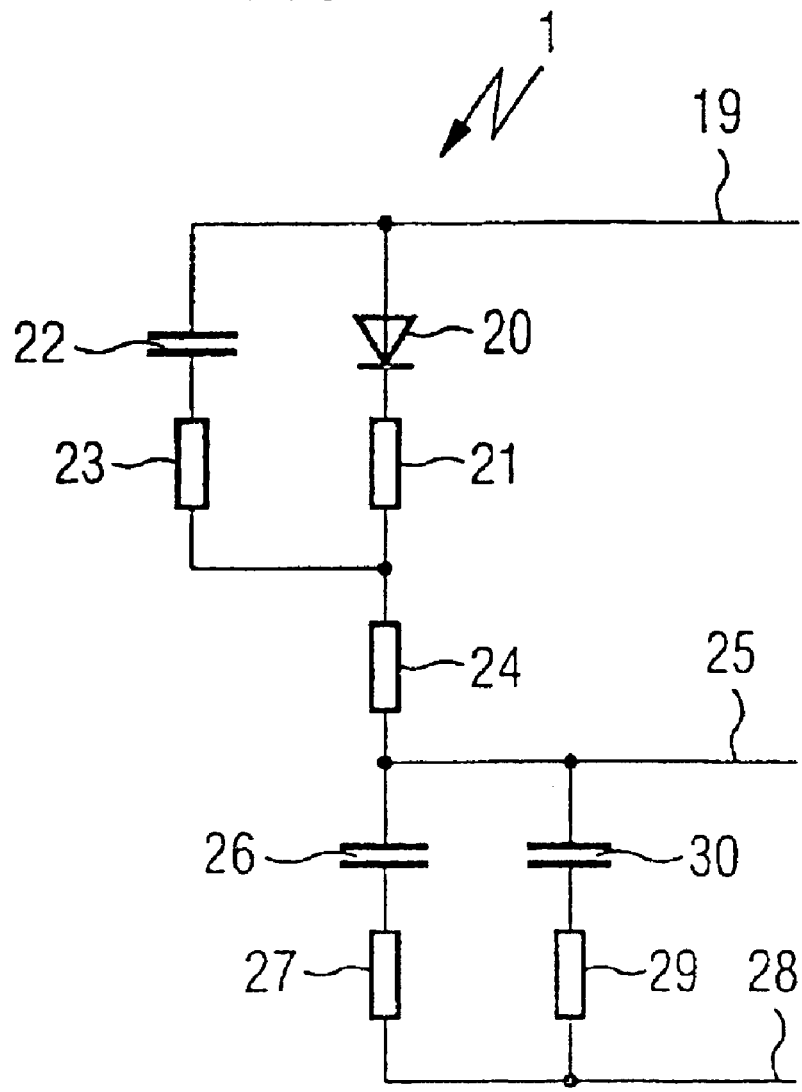
FIG. 2 is an equivalent circuit diagram for the varactor from FIG. 1.
Figure 15:
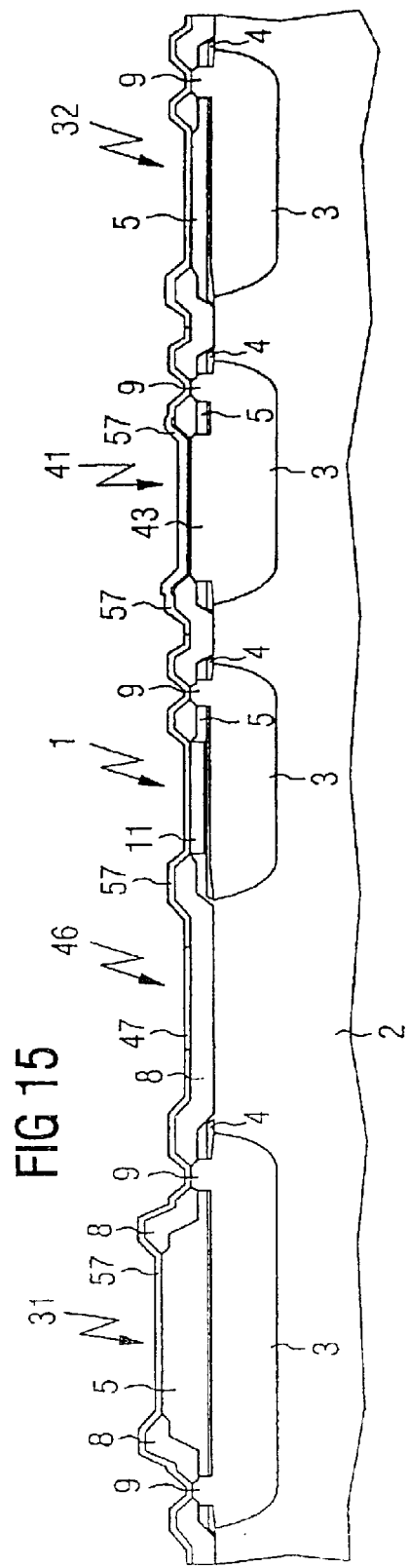

FIG. 2 shows an equivalent circuit diagram for the tuning diode or the varactor 1 shown in FIG. 1. The equivalent circuit diagram has a base terminal 19 which corresponds to the terminal 15 in the base region 7. The base terminal 19 leads to an ideal diode 20 which is connected in series with an ohmic resistor 21. A capacitance 22 is connected in series with a further ohmic resistor 23, and in parallel with the ideal diode 20. The resistors 21 and 23 represent the losses in the connecting contacts 15, the base contact layer 13, the base layer 12 and the profiled implantation 11. A further series resistor 24 leads to a collector terminal 25 that corresponds to the connecting contact 15 in the collector contact region 9. The resistance 24 illustrates the losses in the well 3.

The capacitance 22 represents the capacitance for the pn-type junction along the boundary area between the base layer 12 and the profiled implantation 11. In addition, there is a further pn-type junction between the well 3 and the substrate 2. The capacitance of this pn-type junction is represented in the equivalent circuit diagram in FIG. 2 by a boundary area capacitance 26. The bleeder resistance through the substrate 2 to an alloy island conducted to ground is illustrated in FIG. 2 by a substrate resistor 27 that leads to a ground terminal 28.

If a channel stop implantation has been introduced in the region of the epitaxial layer 5, there is a conductive layer between the substrate 2 and the channel stop implantation. In addition, the autodoped buffer layer 4 forms a conductive layer. The resistance of the two conductive layers is combined in FIG. 2 in an edge layer resistor 29. The fact that both conductive layers act via a coupling capacitance is allowed for in FIG. 2 by an edge layer capacitance 30.

In order to keep the losses of the varactor 1 as small as possible, it is necessary to keep the well resistance 24 as low as possible. This is achieved by the high doping of the well 3.

Moreover, it is necessary to limit, as much as possible, the losses generated in the conductive edge layers. In the exemplary embodiment illustrated in FIG. 1, there is therefore no channel stop implantation provided in the epitaxial layer 5. The channel stop implantation can be dispensed with as the parasitic bipolar transistor between the wells 3 is too slow to play a role technically at the relevant high frequencies. The only important factor is that this parasitic bipolar transistor cannot assume a state that leads to problems. Model calculations have shown that when there is a clear spacing of 20 μm, the base region of the parasitic bipolar transistor, which is located between the wells 3, acts as a high impedance resistance region that exhibits capacitive behavior at the relevant high frequencies.

In addition, the conductive, autodoped buffer layer 4 has been removed outside the region of the well 3 before the epitaxial layer was grown on.

These measures ensure a low edge layer resistance 29 and a negligibly small edge layer capacitance 30 so that the edge layer losses can be ignored.

In the modified exemplary embodiment (not illustrated) of the varactor 1, the buffer layer 4 is applied, together with the epitaxial layer 5, in an epitaxy operation and is subsequently etched back outside the region of the well 3 to the substrate 2. However, this is possible only if the resulting step of approximately 1 μm can be tolerated in the following processes.

However, if value is placed on having the flattest possible structure, it is advantageous to first grow on the buffer layer 4 with a thickness of 0.15 μm, and then to etch it back by 0.2 μm outside the region of the well 3. In this way, the autodoped buffer layer is completely removed with a high degree of certainty so that there is no conductive layer produced along the boundary area between the substrate and the insulating layer lying above it.

Even with other types of components having a semiconductor structure, the losses can be limited by providing a buffer layer 4 and subsequently etching back the buffer layer 4 outside the region of the wells 3.

For example, a PIN diode 31 is illustrated in FIG. 3. In this PIN diode 31, the intrinsic region is formed by an epitaxial layer with a large thickness, which is etched in a mesa form in the base region 7.

Furthermore, a bipolar transistor 32 with low collector losses is illustrated in cross section in FIG. 4. The bipolar transistor 32 also has the buffer layer 4 which is removed outside the well 3. A collector deep implantation 33 is introduced in the base region 7 in the epitaxial layer 5 lying above the buffer layer 4. The collector deep implantation 33 is adjoined by the base layer 12 with a base zone 34. The base zone 34 surrounds an emitter zone 35 which is adjoined by an emitter contact layer 36. To the side, the emitter contact layer 36 is bounded by spacer elements 37. The base contact layer 13 and the emitter contact layer 36 are connected to conductor tracks 17 via connecting contacts 15.

As already stated in connection with the varactor illustrated in FIG. 1, the collector losses are also kept low in the PIN diode 31 and the bipolar transistor 32 by interrupting the buffer layer 4.

For this purpose, it is, however, also necessary to have a sufficiently clear space between the wells 3 of the components, as otherwise the parasitic bipolar transistor between the wells 3 gives rise to losses.

An exemplary embodiment with which high packing densities are possible is illustrated in FIG. 5 using the example of a modified bipolar transistor 38 and adjacent wells 3. In this exemplary embodiment, the wells 3 are surrounded by boundary regions 39 with an increased, opposite doping. For example, the substrate 2 is p-type doped, and the n-type doped wells 3 are surrounded by a p-type doped boundary region 39 with an increased concentration. As a result, the boundary area capacitance 26 (see FIG. 2) is reduced. In addition, a packing density such as that in conventional components is possible because the wells 3 are effectively electrically isolated by the boundary regions 39.

In order to ensure the electrical isolation of the wells 3 in every operating state, an isolating region 40 is also provided, which is connected via a connecting contact 15 to a conductor track 17 which is at ground potential. This ensures that the parasitic bipolar transistor between the wells 3 is not opened.

In FIG. 6, finally a capacitor 41 is illustrated whose anode 42 is formed by the well 3 and an electrode implantation 43 in the epitaxial layer 5. An intermediate dielectric 44, on which a cathode 45 of the capacitor 41 is mounted, is arranged after the electrode implantation 43.

Here too, losses are avoided by providing a buffer layer which is restricted in its extent by the region of the well 3.

The removal of the autodoped buffer layer 4 outside the region of the wells 3 is also advantageous for passive components which do not require a well 3 in the substrate 2.

For example, an ohmic resistor 46 is illustrated in FIG. 7. The resistor 46 is formed by a resistance layer 47 on the insulating layer 8. The resistance layer 47 is composed, for example, of a silicon layer with low boron doping.

As there is no autodoped buffer layer 4 along the boundary area between the substrate 2 and the insulating layer 8, there are also no charge carriers along this boundary area. Therefore, the capacitive coupling of the resistance layer 47 to the substrate 2 does not lead to parasitic losses.

The high impedance substrate 2 can also be advantageous when manufacturing coils 48 in the semiconductor structure. FIG. 8 shows an embodiment of such a coil 48. The conductor tracks 17, which lead through the intermediate layer dielectric 18 via connecting contacts 50 to a first turn 51 and a second turn 52, are arranged in a first metal plane 49. The first turn 51 and the second turn 52 are embedded in a layer dielectric 53. The plane in which the first turn 51 and the second turn 52 are located is also referred to as the second metal plane 54.

It has become apparent that inductances with a high quality can be manufactured on the high impedance substrate with frequencies of up to 1 GHz if the metalization layer thickness in the second metal plane 54 can be kept to approximately twice the depth of the skin, that is to say approximately 4 µm. Inductances with qualities of over 50 at a frequency of 0.8 GHz can be implemented with coil diameters of less than 500 µm. Even higher quality levels can be achieved if coils with larger coil diameters are used. However, the parallel capacitances then increase. This is because, on the one hand, the capacitance between the turns increases, and on the other hand, the capacitance between the turns and the substrate rises. In addition, losses occur as a result of the line resistance of the turns 51 and 52 and the parallel resistance of the substrate 2. This parallel resistance is due to autodoping of the buffer layer 4, which is for example, still present if the buffer layer 4 is not removed.

A high impedance substrate 2 is of particular significance for the coils 48 as it is not possible to prevent losses by using a substrate that is a good conductor. In particular, the resistivity of silicon with optimum values of 3 Ωcm is not sufficient to avoid large losses.

It should be noted that a metal that is a good conductor has to be used as the corresponding ground electrode for the coils 48. In the case of the high impedance substrate 2, this is the rear metalization of the substrate 2.

Manufacturing the components described in FIGS. 1 to 8 will be described below by way of example with reference to FIGS. 9 to 20.

FIG. 9 is a cross sectional view of the substrate 2. Here the substrate 2 is p-type conductive silicon with a resistivity of 1 kΩcm and a crystal orientation in the <100> direction. An oxide layer 55 with a thickness of 1 µm is oxidized onto the substrate 2. The oxide layer 55 is then patterned in such a way that it has windows at the points provided for the wells 3. If appropriate, the oxide layer 55 can also have windows for the isolating regions 40. If appropriate, the boundary regions 39 of the substrate 2 are formed by implanting boron with a concentration of $2 \times 10^{13}$ cm$^{-2}$ and a subsequent diffusion process at 1170° C. for 500 minutes. This is followed by the implantation of arsenic with a concentration of $2.2 \times 10^{16}$ cm$^{-2}$ with an ion energy of 100 keV. The arsenic diffuses into the substrate 2 to a depth of 10 µm in a subsequent diffusion process at 1170° C. having a duration of 1000 minutes.

The result of these method steps is illustrated in FIG. 9 (the boundary regions 39 have not been illustrated).

The oxide layer 55 is then removed by etching, and the buffer layer 4 is grown on epitaxially to a depth of 0.3 µm of undoped material. This results in a structure having the cross section illustrated in FIG. 10.

In further method steps, a photoresist layer 56 is applied to the buffer layer 4. The photoresist layer 56 is then patterned such that in a subsequent etching process, the buffer layer 4 outside the region of the wells 3 is removed. The buffer layer 4 is expediently etched back into the substrate 2, which ensures the complete removal of the buffer layer 4, so that a structure having the cross section shown in FIG. 11 is obtained.

This is followed by growing on the epitaxial layer 5 including patterning the epitaxial layer 5 in order, for example, to form a mesa structure in the region of the PIN diode 31. The epitaxial layer 5 is also etched back in the region of the varactor 1, the capacitor 41, and the bipolar transistor 32, as illustrated in FIG. 12.

This is followed by a local oxidation of the epitaxial layer 5, which as illustrated in FIG. 13, gives rise to an insulating layer 8 that is up to 850 nm thick.

This is followed by the implantation of phosphorus and its deep diffusion to form the collector contact regions 9, and in particular, the electrode implantation 43 of the capacitor 41. This results in the state shown in FIG. 14.

In further method steps, the intermediate dielectric 44 of the capacitor 41 and the profiled implantation 11 of the varactor 1 are formed. This is then followed by the deposition of a 200 nm thick polysilicon layer 57 into which boron is implanted in the region of the resistor 46 in order to form the resistance layer 47 in the region of the resistor 46. Otherwise, the polysilicon layer 57 is weakly doped with boron in order to prepare the base layer 12, and the cathode 45 in the region of the capacitor 41.

Figure 16:
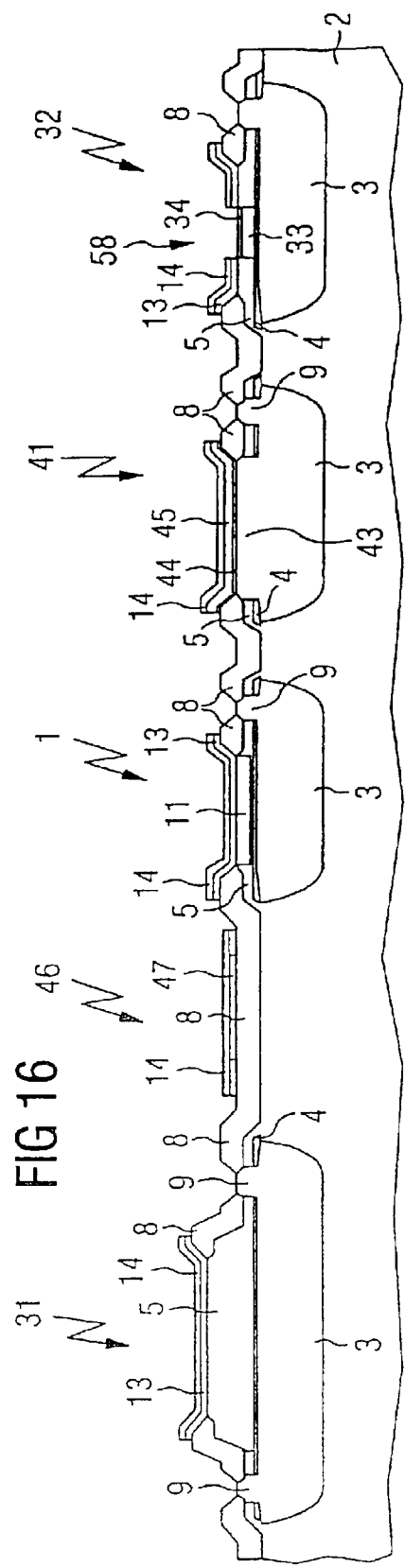

According to FIG. 16, an oxide layer with a thickness of 300 nm is then deposited on the polysilicon layer 57 in order to produce the contact insulating layer 14. The polysilicon layer 57 is patterned with the oxide layer lying above it, in one etching process. Here, an emitter contact hole 58 that extends at least through the base layer 12 is etched out in the region of the bipolar transistor 38. In the remaining part of the epitaxial layer 5, the collector deep implantation 33 is formed by the implantation of phosphorus. This is followed by implanting boron to make the base zone 34. After these method steps are completed, the cross section illustrated in FIG. 16 is obtained.

In FIG. 17 the method has already progressed further. First, the spacer elements 37 have been formed in the emitter contact hole 58. This is expediently carried out by conformal deposition and subsequent anisotropic etching. In addition, the collector contact layers 10 and the emitter contact layers 37 have been formed by depositing polysilicon and subsequent patterning.

Then, as shown in FIG. 18, the cover layer 16 of boron-containing phosphorus glass is deposited over the entire area with a thickness of up to 1200 nm. In the subsequent flowing at 800° C., the boron atoms diffuse out of the base contact layer 13 into the epitaxial layer underneath and form the base layers 12. In the bipolar transistor 32, in particular, the emitter zone 35 is manufactured by the diffusion of the phosphorus atoms in the emitter contact layer 36.

It is particularly advantageous if the flowing is performed at two points where the temperature is held, on the one hand between 750 and 850° C. and on the other hand between 1000 and 1100° C. As the temperature sensitivity of the parameters of the bipolar transistor 38 is particularly high at low temperatures, and the temperature sensitivity of the parameters of the PIN diode 31 and of the varactor 1 are particularly high at high temperatures, the doping profiles in the varactor 1 and in the bipolar transistor 38 can be respectively optimized by the flowing at different temperatures.

Then, holes for the connecting contacts 15 are etched into the cover layer 16 and are filled with tungsten so that the cross section shown in FIG. 18 is finally obtained.

According to FIG. 19, a layer made of AlSiCu is then sputtered onto the cover layer 16 and is patterned, which produces the conductor tracks 17. A 2 μm thick oxide layer is deposited on the conductor tracks 17 as the intermediate layer dielectric 18.

According to FIG. 20, contact holes for the connecting contacts 50 are etched into this intermediate layer dielectric 18. This is then followed by vapor deposition using TiAu. In addition, up to 7 μm of Au is deposited galvanically in order to form conductor tracks 59 of the second metal plane 54. If appropriate, the turns 51 and 52 of the coil 48 are also manufactured here.

Finally, it is noted that the method described with reference to FIGS. 9 to 20 markedly reduces the edge losses due to conductive, autodoped epitaxial layers. The method makes use of the fact that at the start of the epitaxial growth, the doping atoms vaporize out of the wells 3 and are introduced into the epitaxial layer. However, as the layer thickness of the epitaxial layer increases, this effect decreases rapidly. Therefore, it is sufficient to deposit the buffer layer in the region between the wells 3 in order to prevent the formation of conductive layers between the wells 3 and to allow the substrate 2 and the epitaxial layer 5 to assume a high impedance in this region. As there are only a few doping atoms at the surface of the buffer layer 4, the well 3 is, as it were, sealed for subsequent epitaxy processes by the buffer layer 4. This leads to a situation in which the epitaxial layer 5 that is arranged afterwards hardly contains any doping atoms and exhibits a good insulating effect.

However, it is also noted that it is possible for an intermediate layer whose thickness corresponds to the buffer layer 4 and to the epitaxial layer 5 to be applied epitaxially to the substrate 2 first, and for the intermediate layer then to be etched back in the region between the wells 3 as far as the substrate 2 in order to remove the particularly highly autodoped regions of the intermediate layer in the region between the wells 3. This modification of the method is particularly suitable if steps of up to 1 μm are to be tolerated in the following method steps.

We claim:

1. A method for manufacturing a high frequency semiconductor structure, which comprises:

preparing a substrate;

forming a doped well on one side of the substrate;

epitaxially growing a buffer layer, made of an undoped material, on a top side of the well for inhibiting an outdiffusion of a dopant from the well; and at least partially removing a portion of the buffer layer covering the substrate to provide the buffer layer with lateral extensions corresponding to lateral extensions of the well and to provide at least a portion of the substrate outside the well uncovered by the buffer layer.

2. The method according to claim 1, which comprises: completely removing the portion of the buffer layer covering the substrate.

3. The method according to claim 1, wherein: the substrate is a high impedance substrate with a resistivity greater than 1 kΩcm.

4. The method according to claim 1, wherein: the well is doped with a concentration of more than $6 \times 10^{19}$ cm$^{-3}$.

5. The method according to claim 1, which comprises: after processing the buffer layer, applying layered sequences to form bipolar transistors and varactors.

6. The method according to claim 1, which comprises: after performing the step of applying the layered sequences, performing a brief heat treatment between 750° C. and 850° C. and between 1000° C. and 1100° C.

7. The method according to claim 1, which comprises: forming a well having an edge in the substrate; the substrate having a region at the edge of the well with an increased doping with respect to remaining portions of the substrate.

8. The method according to claim 7, which comprises: connecting the region at the edge of the well to a ground contact.

9. A semiconductor structure for high frequencies, comprising:

a substrate having a doped well formed therein; and a buffer layer made of substrate material covering said well;

said buffer layer made of an undoped material and disposed on a top side of said well for inhibiting an outdiffusion of a dopant from said well;

said buffer layer having lateral extensions corresponding to lateral extensions of said well;

at least a portion of said substrate outside said well being uncovered by said buffer layer.

10. The semiconductor structure according to claim 9, comprising: a bipolar transistor formed in said substrate; said transistor having a collector formed by said well.

11. The semiconductor structure according to claim 9, comprising: a varactor having an electrode formed by said well.

12. The semiconductor structure according to claim 9, comprising: a PIN diode having an electrode formed by said well.

13. The semiconductor structure according to claim 9, comprising: a capacitor having an electrode is formed by said well.

14. The semiconductor structure according to claim 9, comprising: a resistor manufactured from a semiconductor material; said resistor being formed on said substrate.

15. The semiconductor structure according to claim 9, comprising: a coil formed from conductor tracks.

* * * * *